(12) United States Patent
Yang

(10) Patent No.: US 10,992,312 B2
(45) Date of Patent: Apr. 27, 2021

(54) SEMICONDUCTOR DEVICE AND OPERATING METHOD OF MATCHING HARDWARE RESOURCE TO COMPRESSION/DECOMPRESSION ALGORITHM

(71) Applicant: Seung-Soo Yang, Gyeonggi-do (KR)

(72) Inventor: Seung-Soo Yang, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 411 days.

(21) Appl. No.: 14/962,841

(22) Filed: Dec. 8, 2015

(65) Prior Publication Data
US 2016/0173125 A1   Jun. 16, 2016

(30) Foreign Application Priority Data

Dec. 10, 2014  (KR) .................. 10-2014-0177553

(51) Int. Cl.
| | | |
|---|---|---|
| *H03M 7/30* | (2006.01) | |
| *G06F 16/215* | (2019.01) | |
| *G06F 16/23* | (2019.01) | |

(52) U.S. Cl.
CPC ............ *H03M 7/60* (2013.01); *G06F 16/215* (2019.01); *G06F 16/2365* (2019.01); *H03M 7/30* (2013.01); *H03M 7/607* (2013.01); *H03M 7/6017* (2013.01); *H03M 7/6082* (2013.01)

(58) Field of Classification Search
CPC ...... H03M 7/60; H03M 7/607; H03M 7/6082; G06F 17/30303; G06F 17/30371
USPC ......................................................... 707/693
See application file for complete search history.

(56) References Cited

U.S. PATENT DOCUMENTS

| | | |
|---|---|---|
| 5,384,567 A | 1/1995 | Hassner et al. |
| 6,145,069 A | 11/2000 | Dye |
| 6,522,327 B2 | 2/2003 | Deering |
| 6,885,319 B2 | 4/2005 | Geiger et al. |
| 7,020,341 B2 | 3/2006 | Satoh |
| 7,129,860 B2 | 10/2006 | Alvarez, II et al. |
| 7,190,284 B1 | 3/2007 | Dye et al. |

(Continued)

FOREIGN PATENT DOCUMENTS

CN       103124957       5/2013

OTHER PUBLICATIONS

Chinese Office Action dated Oct. 24, 2019 issued in counterpart application No. 201510916887.3, 14 pages.

*Primary Examiner* — Syed H Hasan
*Assistant Examiner* — Nicholas E Allen
(74) *Attorney, Agent, or Firm* — The Farrell Law Firm, P.C.

(57) ABSTRACT

Disclosed is an operating method of a semiconductor device, including acquiring resource information on a plurality of hardware resources, receiving a compression request or a decompression request for data, acquiring context information on the semiconductor device, in response to receiving the compression request or the decompression request for the data, selecting a compression algorithm for compressing or decompressing the data, based on the context information, selecting, among the plurality of hardware resources, a hardware resource for performing the selected compression algorithm, based on the acquired resource information, and compressing or decompressing the data using the selected compression algorithm and the selected hardware resource.

20 Claims, 15 Drawing Sheets

(56) References Cited

U.S. PATENT DOCUMENTS

| | | |
|---|---|---|
| 7,209,972 B1 | 4/2007 | Ignatius et al. |
| 7,239,753 B2 | 7/2007 | Terao |
| 7,714,747 B2 | 5/2010 | Fallon |
| 8,106,799 B1 | 3/2012 | Yang et al. |
| 8,164,490 B2 | 4/2012 | Itani |
| 8,170,335 B2 | 5/2012 | Balster et al. |
| 8,279,096 B2 | 10/2012 | Nov et al. |
| 8,380,688 B2 | 2/2013 | Gruhl et al. |
| 8,502,707 B2 | 8/2013 | Fallon |
| 8,606,942 B2 | 12/2013 | Perlman et al. |
| 8,738,860 B1* | 5/2014 | Griffin ............... G06F 12/0897 |
| | | 711/122 |
| 2002/0101367 A1 | 8/2002 | Geiger et al. |
| 2010/0011012 A1* | 1/2010 | Rawson ............... H04L 67/30 |
| | | 707/E17.009 |
| 2010/0223237 A1 | 9/2010 | Mishra et al. |
| 2011/0235720 A1* | 9/2011 | Banterle ............... G06T 5/009 |
| | | 375/240.25 |
| 2012/0014457 A1 | 1/2012 | He et al. |
| 2012/0041931 A1 | 2/2012 | Ross |
| 2012/0254594 A1 | 10/2012 | Hall et al. |
| 2012/0307892 A1 | 12/2012 | Xu et al. |
| 2013/0044810 A1 | 2/2013 | Kao et al. |
| 2013/0176323 A1 | 7/2013 | Son et al. |
| 2014/0095579 A1 | 4/2014 | Shah et al. |
| 2014/0101306 A1* | 4/2014 | Murgia ............... H04L 47/125 |
| | | 709/224 |
| 2014/0104085 A1 | 4/2014 | Cohen |
| 2014/0105512 A1 | 4/2014 | Uro et al. |
| 2014/0105514 A1 | 4/2014 | Wu et al. |
| 2014/0108704 A1 | 4/2014 | Boring |
| 2014/0167987 A1 | 6/2014 | Pell et al. |
| 2014/0189281 A1* | 7/2014 | Sokol, Jr. ............... G06F 12/08 |
| | | 711/171 |

* cited by examiner

1200

1300

1400

SEMICONDUCTOR DEVICE AND OPERATING METHOD OF MATCHING HARDWARE RESOURCE TO COMPRESSION/DECOMPRESSION ALGORITHM

PRIORITY

This application claims priority under 35 U.S.C. § 119(a) to Korean Patent Application No. 10-2014-0177553, which was filed in the Korean Intellectual Property Office on Dec. 10, 2014, the entire content of which is incorporated herein by reference.

BACKGROUND

1. Field of the Disclosure

The present disclosure relates to a semiconductor device and an operating method thereof.

2. Description of the Related Art

There has been a rapid demand for increased memory capacity in a semiconductor device of a mobile environment. As a result, there is a need in the art for a technique which compresses data or decompresses the compressed data in the semiconductor device of the mobile environment. Specifically, a compression algorithm for efficiently compressing or decompressing the data and hardware for performing the compression algorithm are needed in the art in order to compress or decompress the data.

SUMMARY

Accordingly, an aspect of the present disclosure is to provide a semiconductor device that compresses and decompresses data in a context friendly scheme.

Another aspect of the present disclosure is to provide an operating method of a semiconductor device that compresses and decompresses data in a context friendly scheme.

In accordance with an aspect of the present disclosure, an operating method of a semiconductor device includes acquiring resource information on a plurality of hardware resources, receiving a compression request or a decompression request for data, acquiring context information on the semiconductor device, in response to receiving the compression request or the decompression request for the data, selecting a compression algorithm for compressing or decompressing the data, based on the context information, selecting, among the plurality of hardware resources, a hardware resource for performing the selected compression algorithm, based on the acquired resource information, and compressing or decompressing the data using the selected compression algorithm and the selected hardware resource, wherein the plurality of hardware resources includes a heterogeneous hardware resource.

In accordance with another aspect of the present disclosure, an operating method of a semiconductor device includes acquiring resource information on a plurality of hardware resources, receiving a compression request or a decompression request for data, acquiring context information on the semiconductor device, in response to receiving the compression request or the decompression request for the data, selecting a compression algorithm for compressing or decompressing the data, based on the context information, selecting, from among the plurality of hardware resources, a first hardware resource for performing the selected compression algorithm for a first workload of the data, and a second hardware resource for performing the selected compression algorithm for a second workload of the data, based on the acquired resource information, compressing or decompressing the first workload using the selected compression algorithm and the first hardware resource, and compressing or decompressing the second workload using the selected compression algorithm and the second hardware resource, wherein the plurality of hardware resources includes a heterogeneous hardware resource.

In accordance with another aspect of the present disclosure, an operating method of a chip set includes acquiring resource information on a plurality of hardware resources provided in the semiconductor device, acquiring context information by being aware of a change in state of the semiconductor device after receiving a compression request or a decompression request for data, selecting N available compression algorithms among a plurality of compression algorithms, selecting M available hardware resources among the plurality of hardware resources, and selecting the compression algorithm and the hardware resource for compressing or decompressing data by using the context information and the resource information among combinations of the N available compression algorithms and the M available hardware resources, wherein N and M are integers of 1 or more.

In accordance with another aspect of the present disclosure, a semiconductor device includes a plurality of hardware resources including a heterogeneous hardware resource provided to the semiconductor device, a resource information generating unit generating resource information on the plurality of hardware resources, a context information generating unit generating context information by being aware of a change in state of the semiconductor device, a compression algorithm selecting unit selecting a compression algorithm for compressing or decompressing data by using the context information among a plurality of compression algorithms, and a resource selecting unit selecting a hardware resource for performing the selected compression algorithm by using the resource information among the plurality of hardware resources.

In accordance with another aspect of the present disclosure, a chip set comprises a plurality of hardware resources including a heterogeneous hardware resource, a resource information generating unit that generates resource information on the plurality of hardware resources, a context information generating unit that generates context information by being aware of a change in state of the chip set, a compression algorithm selecting unit that selects a compression algorithm for compressing or decompressing data by using the context information among a plurality of compression algorithms, and a resource selecting unit that selects a hardware resource for performing the selected compression algorithm by using the resource information among the plurality of hardware resources.

In accordance with another aspect of the present disclosure, a mobile device comprises a chip set, wherein the chip set comprises a plurality of hardware resources including a heterogeneous hardware resource, a resource information generating unit that generates resource information on the plurality of hardware resources, a context information generating unit that generates context information by being aware of a change in state of the chip set, a compression algorithm selecting unit that selects a compression algorithm for compressing or decompressing data by using the context information among a plurality of compression algorithms, and a resource selecting unit that selects a hardware resource for performing the selected compression algorithm by using the resource information among the plurality of hardware resources.

BRIEF DESCRIPTION OF THE DRAWINGS

The above and other aspects, features and advantages of certain embodiments of the present disclosure will become more apparent by describing in detail embodiments thereof with reference to the attached drawings, in which.

DETAILED DESCRIPTION OF EMBODIMENTS OF THE PRESENT DISCLOSURE

Figure 1:
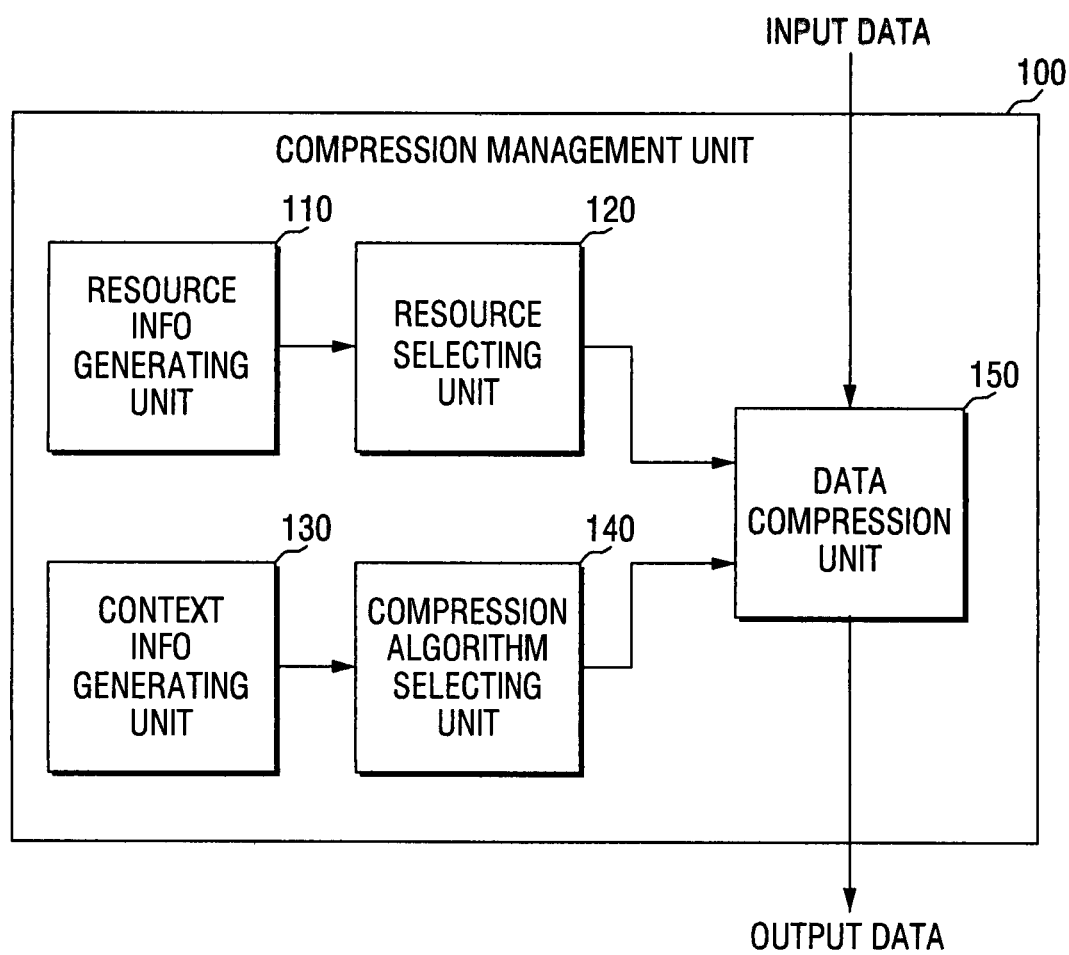
FIG. 1 illustrates a semiconductor device according to an embodiment of the present disclosure.

Various embodiments of the present disclosure are described in detail below with reference to the accompanying drawings. The disclosure, however, may be embodied in various different forms, and should not be construed as being limited only to the illustrated embodiments. Rather, these embodiments are provided as examples so that this disclosure will be thorough and complete, and will fully convey the concept of the disclosure to those skilled in the art. Accordingly, known processes, elements, and techniques are not described with respect to some of the embodiments of the disclosure. In addition, descriptions of well-known functions and constructions are omitted for clarity and conciseness.

Unless otherwise noted, like reference numerals denote like elements throughout the attached drawings and written description, and thus descriptions will not be repeated. Further, in the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Spatially relative terms, such as "beneath", "below", "lower", "under", "above", and "upper" may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having meanings that are consistent with their meanings in the context of the relevant art and/or the present specification and will not be interpreted in an idealized or overly formal sense unless expressly so defined herein.

FIG. 1 illustrates a semiconductor device according to an embodiment of the present disclosure.

Referring to FIG. 1, the semiconductor device includes a compression management unit 100 and a plurality of hardware resources. The compression management unit 100 compresses data according to a compression request or a decompression request received from a user or an application. The compression management unit 100 uses the plurality of hardware resources provided to the semiconductor device in order to compress or decompress the data. In some embodiments of the present disclosure, the plurality of hardware resources includes heterogeneous hardware resources, the semiconductor device includes a mobile device or may be embodied in the mobile device in the form of a chip set, and the plurality of hardware resources includes one or more application processors (APs), one or more cellular processors (CPs), one or more vendor-specific hardware, one or more graphic processing units (GPUs), and one or more digital signal processors (DSPs).

In FIG. 1, the compression management unit 100 includes a resource information generating unit 110, a resource selecting unit 120, a context information generating unit 130, a compression algorithm selecting unit 140, and a data compression unit 150.

The resource information generating unit 110 generates resource information on the plurality of hardware resources. The resource information includes information representing features of the hardware resources provided to the semiconductor device.

For example, the resource information generated by the resource information generating unit 110 includes information on an algorithm, a file type, a type of data, the size of data, and the size of an input/output buffer supported by the corresponding hardware resource. The resource information includes information regarding a compress rate, a compression speed, and whether compression is loss or non-loss compression, when compression is performed by the corresponding hardware resource. The resource information includes information regarding power consumption, a performance index or a work processing speed of the corresponding hardware, and whether the corresponding hardware is usable only as dedicated hardware or as general hardware, when using the corresponding hardware resource. The resource information also includes information such as a load, power consumption, a memory bandwidth, and memory latency of a processor required when the compression or decompression is performed by using the corresponding hardware resource. However, the resource information described in the present disclosure is not limited to items enumerated as above and includes various pieces of information indicating a predetermined feature associated with the corresponding hardware resource.

In some embodiments of the present disclosure, the resource information generating unit 110 receives various pieces of resource information as from system software provided in the semiconductor device.

The resource selecting unit 120 selects the hardware resource for compressing or decompressing the data by using the resource information generated by the resource information generating unit 110 among the plurality of hardware resources. That is, the resource selecting unit 120 selects the hardware resource for performing the compression algorithm selected by the compression algorithm selecting unit 140. For example, when the compression algorithm selected by the algorithm selecting unit 140 is to be performed, the resource selecting unit 120 selects the hardware resource in which a performance index is excellent, i.e., a hardware resource in which processing speed is fast, even though the power consumption therein is high. In contrast, when power is insufficient under an environment in which the compression algorithm selected by the algorithm selecting unit 140 is to be performed, the resource selecting unit 120 selects the hardware resource in which the performance index is less than excellent, but the power consumption is low.

The context information generating unit 130 generates context information by recognizing a change in state of the semiconductor device. Herein, the context information includes context awareness information for awareness of a change of various states of the semiconductor device. That is, the semiconductor device collects context information regarding the state of the semiconductor device at a specific time such as the data compression request and dynamically determines a compression algorithm suitable for data of which compression is requested based on the collected context information.

In some embodiments of the present disclosure, the context information generated by the context information generating unit 130 includes information on data to be compressed, that is, information on the file type, a data format, a primary generation agent of the data, a primary transmission agent of the data, a physical or virtual address of the data, and a traffic pattern of the data. The context information includes information on a scenario for compressing data, such as information on a bandwidth, latency, power, and quality regarding the data compression. In addition, the context information includes information on a power state (for example, a power save mode and a general mode) of the semiconductor device, a state (for example, a usage of the memory or the storage) of a memory or a storage of the semiconductor device, the intensity of a radio communication signal, a value associated with a sensor provided in the semiconductor device, various events which occur in the semiconductor device, and various requests caused by system software. However, the resource information described in the present disclosure is not limited to the foregoing and also includes various pieces of information indicating various states associated with the semiconductor device.

In some embodiments of the present disclosure, the context information generating unit 130 receives various pieces of context information described as above from the system software provided in the semiconductor device.

The compression algorithm selecting unit 140 selects a compression algorithm for compressing or decompressing data by using the context information generated by the context information generating unit 130 among the plurality of compression algorithms. That is, the compression algorithm selecting unit 140 selects a context friendly compression algorithm among the plurality of compression algorithms. For example, when an application requiring the compression data has already been executed and data should be rapidly compressed, the compression algorithm selecting unit 140 selects a compression algorithm having a high compression speed and a lower compression rate. In contrast, when the capacity of the memory or the storage of the semiconductor device, which stores data is insufficient, the compression algorithm selecting unit 140 selects a compression algorithm having a high compression rate and a lower compression speed.

In some embodiments of the present disclosure, the selection of the compression algorithm by the compression algorithm selecting unit 140 or the selection of the hardware resource by the resource selecting unit 120 includes dynamically selecting the compression algorithm and the hardware resource depending on a change of the context information or the resource information.

The data compression unit 150 compresses data by using the compression algorithm selected by the compression algorithm selecting unit 140 and the hardware resource selected by the resource selecting unit 120.

As such, because the compression management unit 100 compresses or decompresses data by selecting a compression algorithm and a hardware resource which are optimal to a detailed application situation by using the resource information regarding the plurality of hardware resources provided in the semiconductor device and the context information regarding a real-time state of the semiconductor device, the compression management unit 100 may efficiently compress data as necessary.

Figure 2:
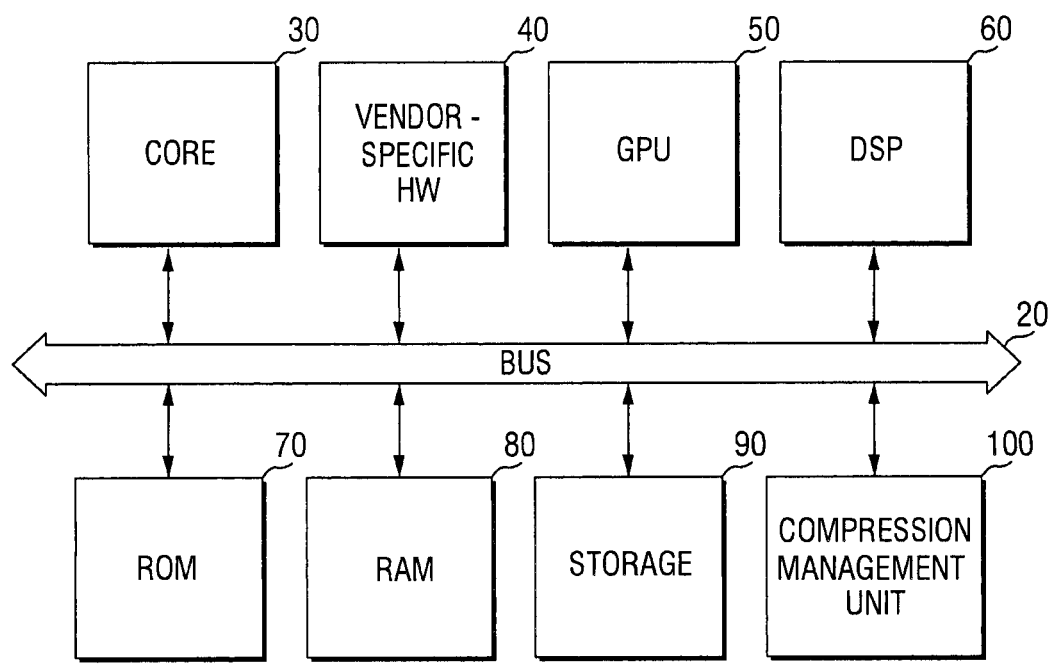
FIG. 2 illustrates a semiconductor system including a semiconductor device according to an embodiment of the present disclosure.

FIG. 2 illustrates a semiconductor system including a semiconductor device according to an embodiment of the present disclosure.

Referring to FIG. 2, the semiconductor system includes a core 30, vendor-specific hardware 40, a graphic processing unit (GPU) 50, a digital signal processor (DSP) 60, a read-only memory (ROM) 70, a random access memory (RAM) 80, a storage 90, and a compression management unit 100, which are electrically connected to each other to transmit and receive data by using a bus 20. In some embodiments of the present disclosure, the core 30 includes an AP and a CP, for example. In some embodiments of the present disclosure, the GPU 50 includes a general purpose GPU (GPGPU), and the storage 90 includes a storage system including a plurality of storage devices as well as a storage device including a hard disk drive (HDD) or a solid state drive in step SD).

The compression management unit 100 described as above uses the core 30, the vendor-specific hardware 40, the GPU 50, and the DSP 60 as the hardware resource for compressing or decompressing data and uses the ROM 70, the RAM 80, and the storage 90 as a target for determining the state (i.e., context) of the semiconductor device. For example, the compression management unit 100 determines the compression algorithm based on context information regarding the ROM 70, the RAM 80, and the storage 90 and determines an appropriate hardware resource by using resource information regarding the core 30, the vendor-specific hardware 40, the GPU 50, and the DSP 60.

FIGS. 3 to 7 illustrate an operating method of a semiconductor device according to an embodiment of the present disclosure.

Figure 3:
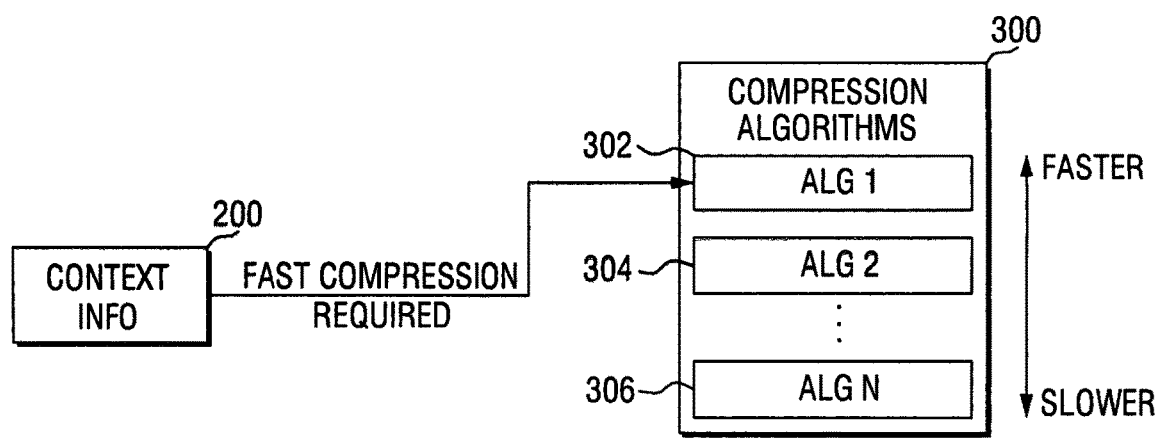
FIGS. 3 to 7 illustrate an operating method of a semiconductor device according to an embodiment of the present disclosure.

Referring to FIG. 3, among the plurality of compression algorithms 300, a performance time of a compression algorithm (ALG 1) 302 is shorter than a performance time of a compression algorithm (ALG 2) 304 and a performance time of the compression algorithm (ALG 2) 304 is shorter than a performance time of a compression algorithm (ALG N) 306. In this case, the compression algorithm selecting unit 140 of the semiconductor device according to the embodiment of the present disclosure selects the compression algorithm (ALG 1) 302 of which the performance time is shortest among the plurality of compression algorithms 300 based on context information 200.

Specifically, when a capacity of a storage that will store resulting data from analyzing the context information 200 is sufficient and an application using data has already been executed, the compression algorithm selecting unit 140 determines that an algorithm in which the performance time is better (i.e., shorter) than the compression rate is appropriate in order to compress data. As a result, the algorithm selecting unit 140 selects the compression algorithm (ALG 1) 302 of which the performance time is shortest among the plurality of compression algorithms 300. Thereafter, the resource selecting unit 120 selects a hardware resource appropriate to perform the compression algorithm (ALG 1) 302 by using the resource information.

Figure 4:
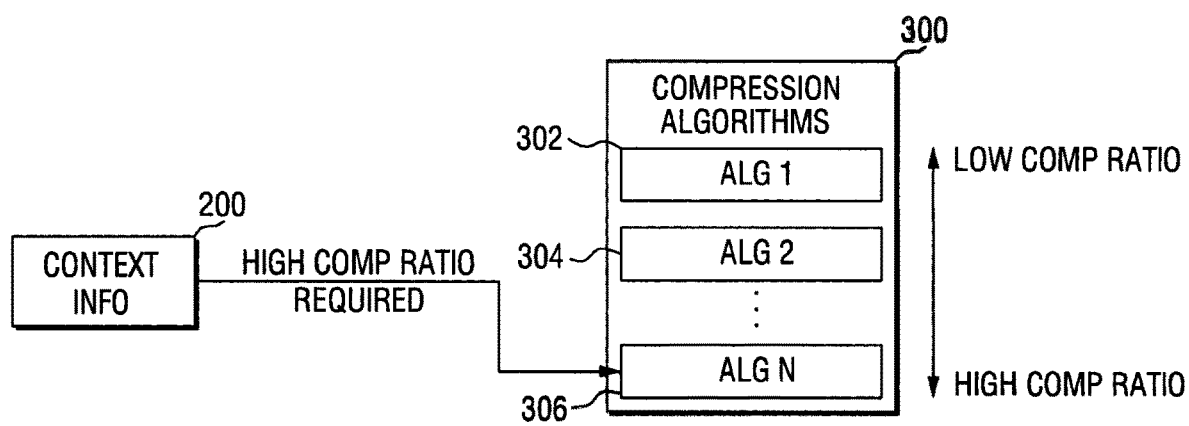

Referring to FIG. 4, among the plurality of compression algorithms 300, a compression rate of the compression algorithm (ALG 1) 302 is lower than a compression rate of the compression algorithm (ALG 2) 304 and the compression rate of the compression algorithm (ALG 2) 304 is lower than a compression rate of a compression algorithm (ALG N) 306. In this case, the compression algorithm selecting unit 140 of the semiconductor device according to the embodiment of the present disclosure selects the compression algorithm (ALG N) 306 of which the compression rate is highest among the plurality of compression algorithms 300 based on the context information 200.

Specifically, when the capacity of the memory or the storage that will store the resulting data from analyzing the context information 200 is insufficient, the compression algorithm selecting unit 140 determines that an algorithm is appropriate, in which the compression rate is better than the performance time in order to compress data. As a result, the algorithm selecting unit 140 selects the compression algorithm (ALG N) 306 of which the compression rate is highest among the plurality of compression algorithms 300. Thereafter, the resource selecting unit 120 selects a hardware resource appropriate to perform the compression algorithm (ALG N) 306 by using the resource information. For example, when the capacity of the memory or the storage that will store the resulting data from analyzing the context information 200 is insufficient and data needs to be encrypted and protected, the resource selecting unit 120 selects a hardware resource having an encryption function to encrypt data while being appropriate to perform the compression algorithm (ALG N) 306.

Figure 5:
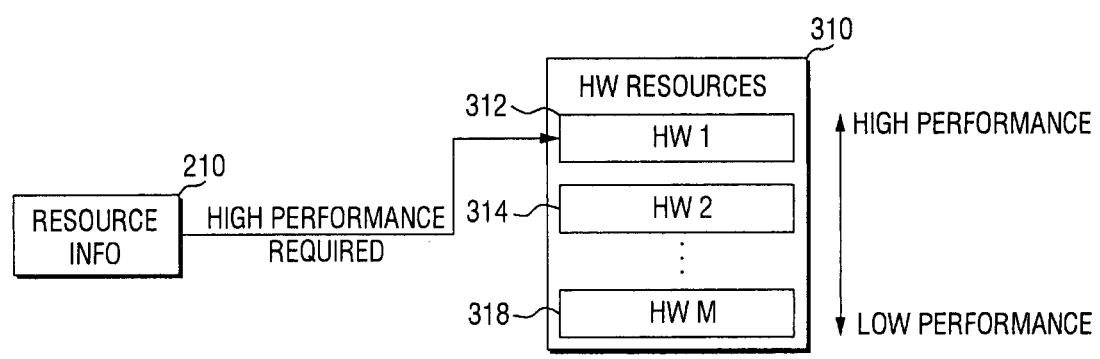

Referring to FIG. 5, for example, among the plurality of hardware resources 310, the processing speed of a hardware resource (HW 1) 312 is faster than the processing speed of a hardware resource (HW 2) 314 and the processing speed of the hardware resource (HW 2) 314 is faster than the processing speed of a hardware resource (HW M) 318. In this case, the resource selecting unit 120 of the semiconductor device according to the embodiment of the present disclosure selects the hardware resource (HW 1) 312 of which the processing speed is fastest among the plurality of hardware resources 310 based on the resource information 210.

Specifically, when the power of the semiconductor device is sufficient and rapid processing is required, the resource selecting unit 120 analyzes the resource information 210 to determine that the hardware resource having the fastest performance, albeit slightly high power consumption, is appropriate in order to compress or decompress data. As a result, the resource selecting unit 120 selects the hardware resource (HW 1) 312 having the fastest performance among the plurality of hardware resources 310. In order to maximize a working speed, the resource selecting unit 120 may select all hardware resources provided in the semiconductor device.

Figure 6:
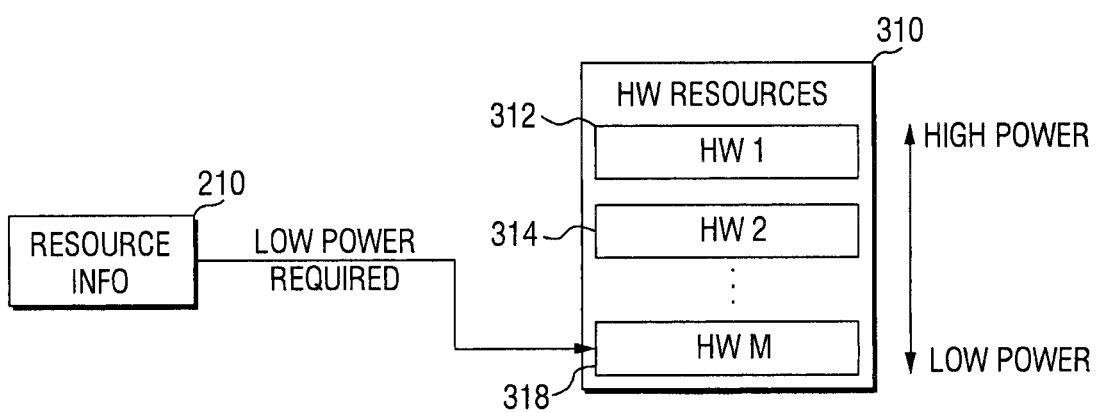

Referring to FIG. 6, for example, among the plurality of hardware resources 310, the power consumption of the hardware resource (HW 1) 312 is higher than the power consumption of the hardware resource (HW 2) 314 and the power consumption of the hardware resource (HW 2) 314 is higher than the power consumption of the hardware resource (HW M) 318. In this case, the resource selecting unit 120 of the semiconductor device according to the embodiment of the present disclosure selects the hardware resource (HW M)

318 having the lowest power consumption among the plurality of hardware resources 310 based on the resource information 210.

Specifically, when the power of the semiconductor device is insufficient, the resource selecting unit 120 analyzes the resource information 210 to determine that the hardware resource having the low power consumption, albeit a slightly low performing speed, is appropriate to compress or decompress data. As a result, the resource selecting unit 120 selects the hardware resource (HW M) 318 having the lowest power consumption among the plurality of hardware resources 310.

Figure 7:
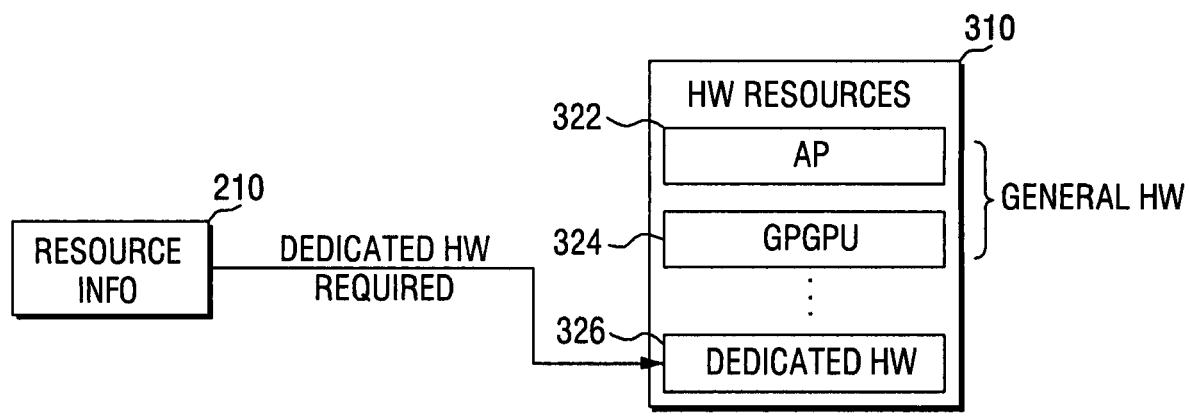

Referring to FIG. 7, the AP 322 or the GPGPU 324, among the plurality of hardware resources 310, corresponds to general hardware that processes a predetermined work and the hardware resource 326 corresponds to dedicated hardware that processes only a specific work. In this case, the resource selecting unit 120 of the semiconductor device according to the embodiment of the present disclosure selects the dedicated hardware resource 326 instead of the general hardware resource such as the AP 322 or the GPGPU 324 based on the resource information 210.

Specifically, when a file having a specific format is compressed or decompressed, the file having the format may be compressed by using the general hardware such as the AP 322 or the GPGPU 324. When it is determined that the resource selecting unit 120 has excellent performance, in particular, when using the hardware resource 326, the resource selecting unit 120 selects the dedicated hardware resource 326 by analyzing the resource information. In this case, the general hardware such as the AP 322 or the GPGPU 324 performs another task, such as graphic rendering in parallel while the hardware resource 326 compresses or decompresses data.

Figure 8:
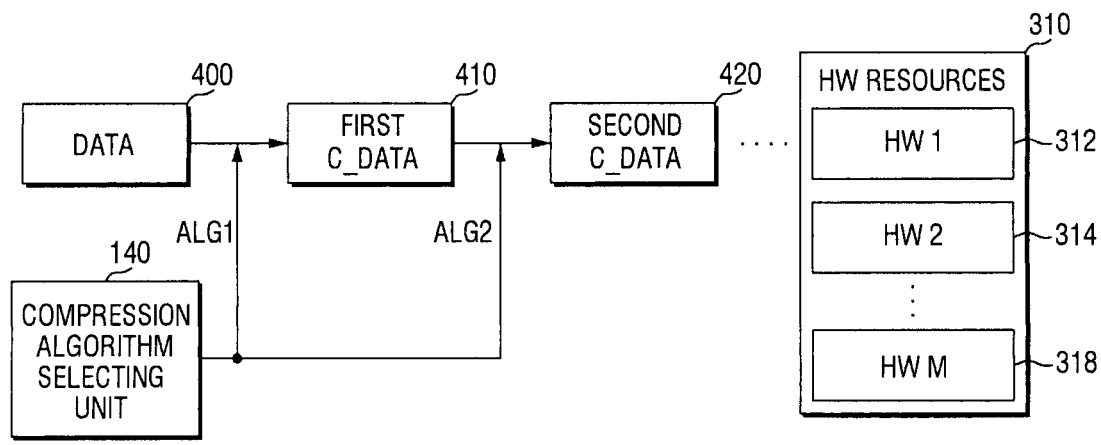
FIG. 8 illustrates an operating method of a semiconductor device according to an embodiment of the present disclosure.

FIG. 8 illustrates an operating method of a semiconductor device according to another embodiment of the present disclosure.

Referring to FIG. 8, the compression algorithm selecting unit 140 selects a first compression algorithm ALG1 for primarily compressing data 400 and a second compression algorithm ALG2 for secondarily compressing first compression data 410 primarily compressed among a plurality of compression algorithms based on the context information. The resource selecting unit 120 selects the hardware resource (HW 1) 312 appropriate to perform the first compression algorithm ALG1 and the second compression algorithm ALG2 among the plurality of hardware resources 310 based on the resource information.

As a result, the data compression unit 150 primarily compresses the data 400 by using the first compression algorithm ALG1 and the hardware resource (HW 1) 312 and secondarily compresses the first compression data 410 by using the second compression algorithm ALG2 and the hardware resource (HW 1) 312. As a result, second compression data 420 is generated.

As to the decompression, the data compression unit 150 primarily decompresses the data 400 by using the first compression algorithm ALG1 and the hardware resource (HW 1) 312 and secondarily decompresses the primarily decompressed data by using the second compression algorithm ALG2 and the hardware resource (HW 1) 312.

Figure 9:
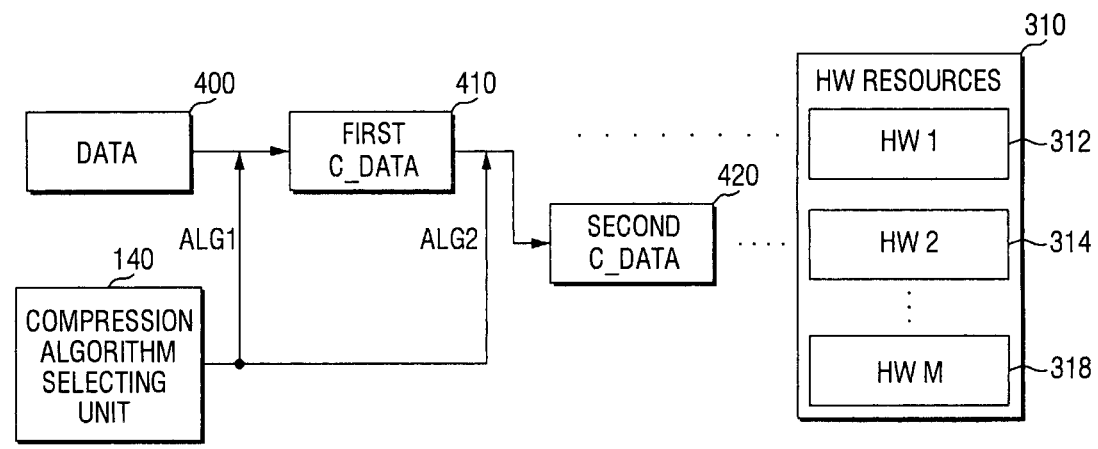
FIG. 9 illustrates an operating method of a semiconductor device according to an embodiment of the present disclosure.

FIG. 9 illustrates an operating method of a semiconductor device according to another embodiment of the present disclosure.

Referring to FIG. 9, the compression algorithm selecting unit 140 selects the first compression algorithm ALG1 for primarily compressing the data 400 and a second compression algorithm ALG2 for secondarily compressing the primarily compressed first compression data 410 among the plurality of compression algorithms based on the context information. The resource selecting unit 120 selects each of the hardware resource (HW 1) 312 appropriate to perform the first compression algorithm ALG1 and the hardware resource (HW 2) 314 appropriate to perform the second compression algorithm ALG2 among the plurality of hardware resources 310 based on the resource information.

As a result, the data compression unit 150 primarily compresses the data 400 by using the first compression algorithm ALG1 and the hardware resource (HW 1) 312 and secondarily compress the first compression data 410 by using the second compression algorithm ALG2 and the hardware resource (HW 2) 314. As a result, the second compression data 420 is generated.

As to the decompression, the data compression unit 150 primarily decompresses the data 400 by using the first compression algorithm ALG1 and the hardware resource (HW 1) 312 and secondarily decompresses the primarily decompressed data by using the second compression algorithm ALG2 and the hardware resource (HW 2) 314.

Figure 10:
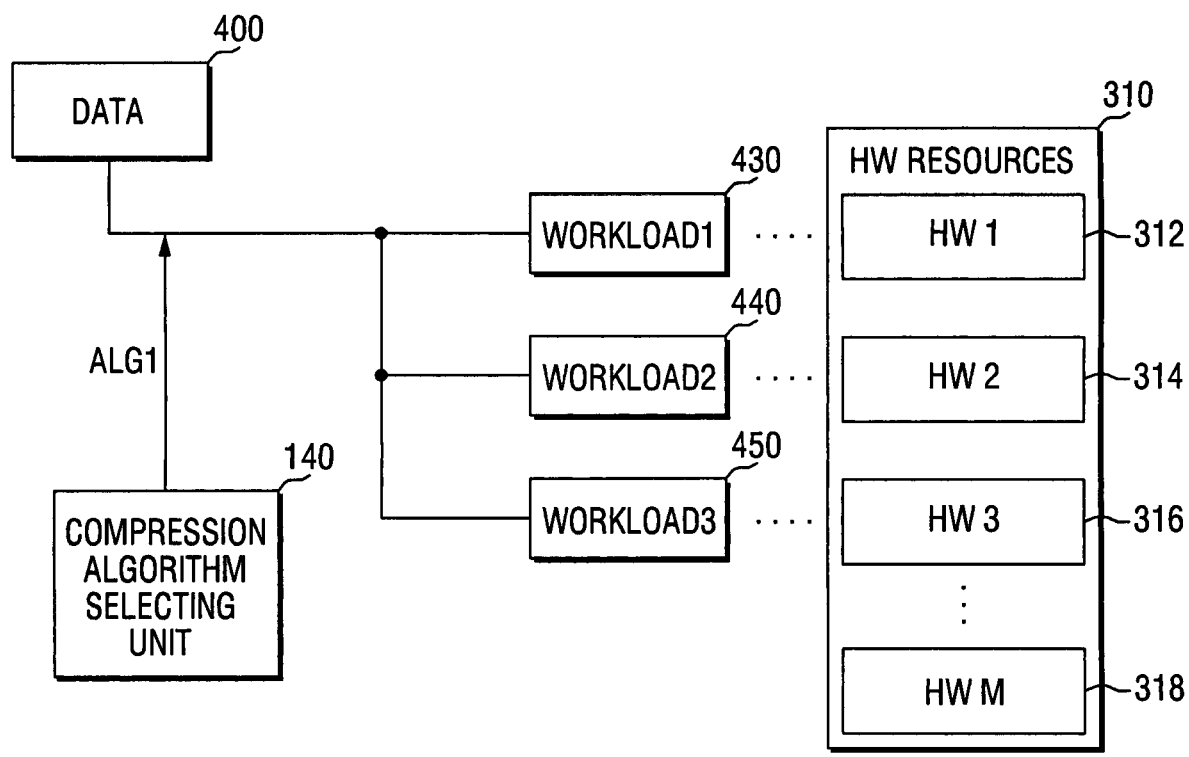
FIG. 10 illustrates an operating method of a semiconductor device according to an embodiment of the present disclosure.

FIG. 10 illustrates an operating method of a semiconductor device according to another embodiment of the present disclosure.

Referring to FIG. 10, the data 400 is separated into a first workload 430, a second workload 440 and a third workload 450. The term "workload" is used herein to describe an amount of work to be processed (e.g. compressed, decompressed). In this case, the compression algorithm selecting unit 140 selects the compression algorithm ALG1 for compressing the first workload 430 to the third workload 450 among the plurality of compression algorithms based on the context information. The resource selecting unit 120 selects each of the hardware resource (HW 1) 312 for compressing the first workload 430, the hardware resource (HW 2) 314 for compressing the second workload 440, and the hardware resource (HW 3) 316 for compressing the third workload 450 among the plurality of hardware resources 310 based on the resource information.

As a result, the data compression unit 150 compresses or decompresses the first workload 430 by using the compression algorithm ALG1 and the hardware resource (HW 1) 312, compresses or decompresses the second workload 440 by using the compression algorithm ALG1 and the hardware resource (HW 2) 314, and compresses or decompresses the third workload 450 by using the compression algorithm ALG1 and the hardware resource (HW M) 318. In some embodiments of the present disclosure, compression or decompression of the first workload 430 to the third workload 450 includes compressing or decompressing two or more workloads among the first workload 430 to the third workload 450 in parallel. In other words, while the hardware resource (HW 1) 312 compresses or decompresses the first workload 430, the hardware resource (HW 2) 314 may compress or decompress the second workload 440 in parallel.

In some embodiments of the present disclosure, by using the hardware resource (HW 1) 312 to the hardware resource (HW 3) 316, the first workload 430 to the third workload 450 may be compressed or decompressed in parallel to predetermined work, for example, graphic rendering work performed by another hardware resource, such as a hardware resource 318 among the plurality of hardware resources provided in the semiconductor device. In some embodiments of the present disclosure, two or more resources among the hardware resource (HW 1) 312 to the hardware resource (HW M) 318 may be heterogeneous hardware resources.

Figure 11:
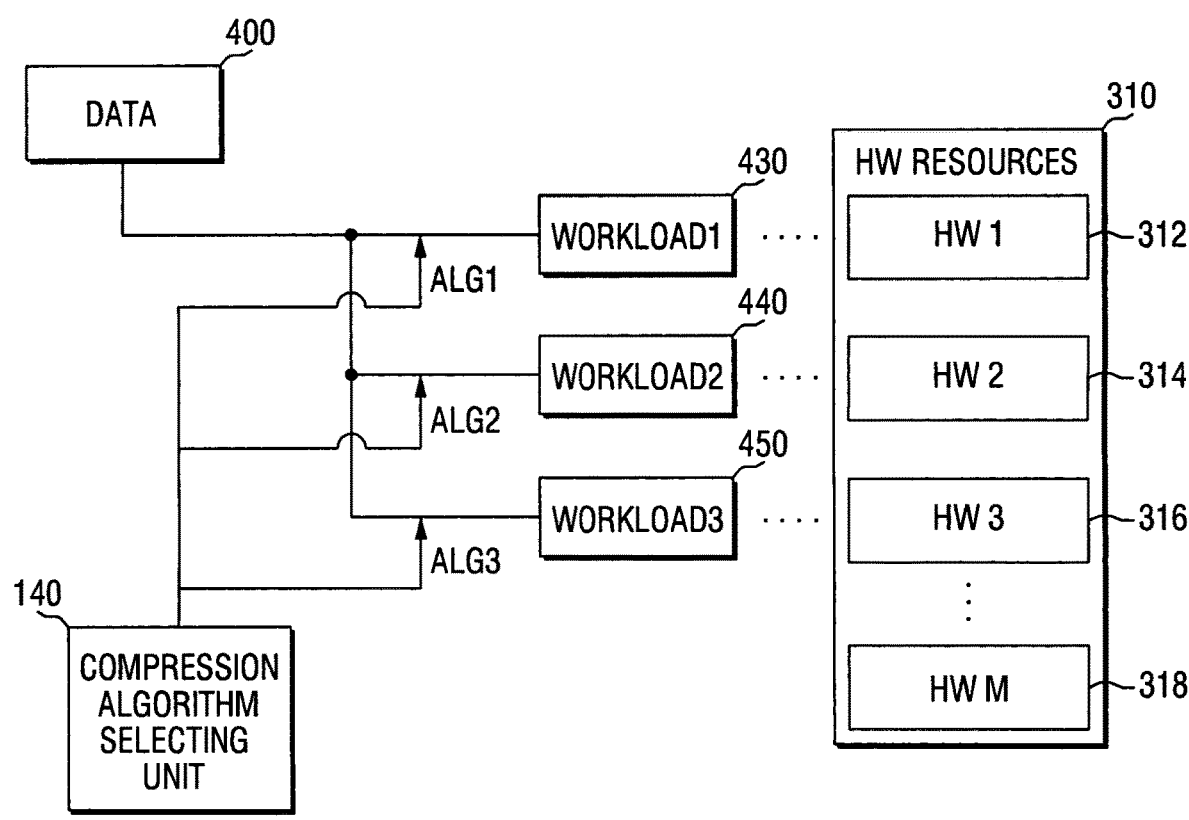
FIG. 11 illustrates an operating method of a semiconductor device according to an embodiment of the present disclosure.

FIG. 11 illustrates an operating method of a semiconductor device according to another embodiment of the present disclosure.

Referring to FIG. 11, the data 400 is separated into the first workload 430 to the third workload 450. In this case, the compression algorithm selecting unit 140 selects the first compression algorithm ALG1 for compressing or decompressing the first workload 430, the second compression algorithm ALG2 for compressing or decompressing the second workload 440, and the third compression algorithm ALG3 for compressing or decompressing the third workload 450 among a plurality of compression algorithms based on context information. The resource selecting unit 120 selects each of the hardware resource (HW 1) 312 for compressing or decompressing the first workload 430, the hardware resource (HW 2) 314 for compressing or decompressing the second workload 440, and the hardware resource (HW 3) 316 for compressing or decompressing the third workload 450 among the plurality of hardware resources 310 based on the resource information.

As a result, the data compression unit 150 compresses or decompresses the first workload 430 by using the first compression algorithm ALG1 and the hardware resource (HW 1) 312, compresses or decompresses the second workload 440 by using the second compression algorithm ALG2 and the hardware resource (HW 2) 314, and compresses or decompresses the third workload 450 by using the third compression algorithm ALG3 and the hardware resource (HW 3) 316. In some embodiments of the present disclosure, the compression or decompression of the first workload 430 to the third workload 450 includes compressing or decompressing two or more workloads among the first workload 430 to the third workload 450 in parallel. In other words, while the hardware resource (HW 1) 312 compresses or decompresses the first workload 430, in parallel with the hardware resource (HW 2) 314 which compresses or decompresses the second workload 440.

Figure 12:
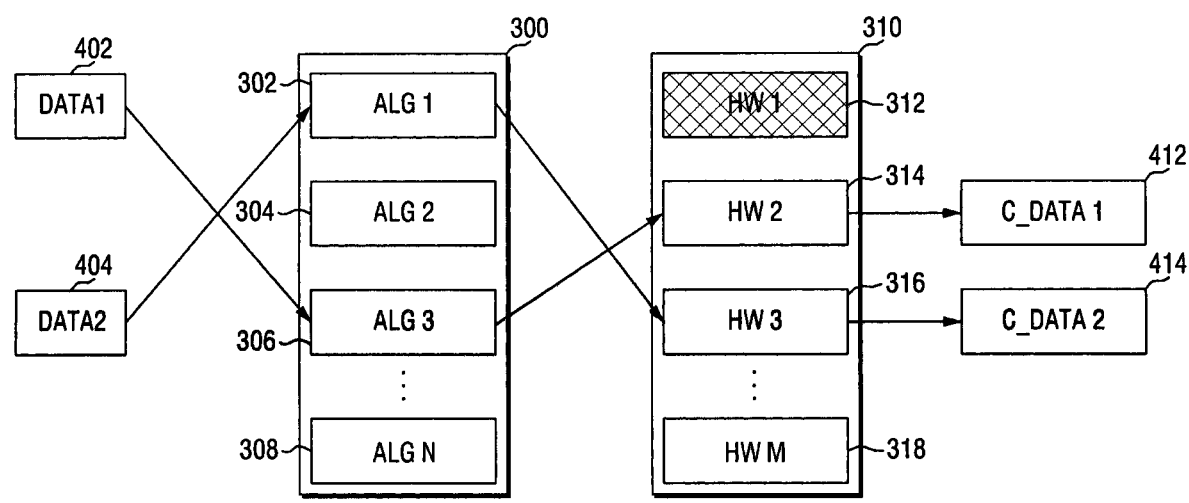
FIG. 12 illustrates an operating method of a semiconductor device according to an embodiment of the present disclosure.

FIG. 12 illustrates an operating method of a semiconductor device according to another embodiment of the present disclosure.

Referring to FIG. 12, data includes first data 402 and second data 404 and the compression management unit 100 may compress the first data 402 and the second data 404 in parallel. In detail, the compression algorithm selecting unit 140 selects the compression algorithm (ALG N) 306 for compressing the first data 402 and selects the compression algorithm (ALG 1) 302 for compressing the second data 402 among the plurality of compression algorithms 300 based on the context information. The resource selecting unit 120 selects the hardware resource (HW 2) 314 for performing the compression algorithm (ALG N) 306 and selects the hardware resource (HW 3) 316 for performing the compression algorithm (ALG 1) 302 among the plurality of hardware resources 310 based on the resource information. Herein, the hardware resource (HW 1) 312 may be performing another task, such as graphic rendering.

As a result, the data compression unit compresses the first data 402 by using the compression algorithm (ALG N) 306 and the hardware resource (HW 2) 314 to output compression data 412 and compresses the second data 404 by using the compression algorithm (ALG 1) 302 and the hardware resource (HW 3) 316 to output compression data 414. In the embodiment, the first data 402 is compressed in parallel to compression of the second data 404 and is compressed in parallel to a task performed by another hardware resource (HW 1) 312.

Figure 13:
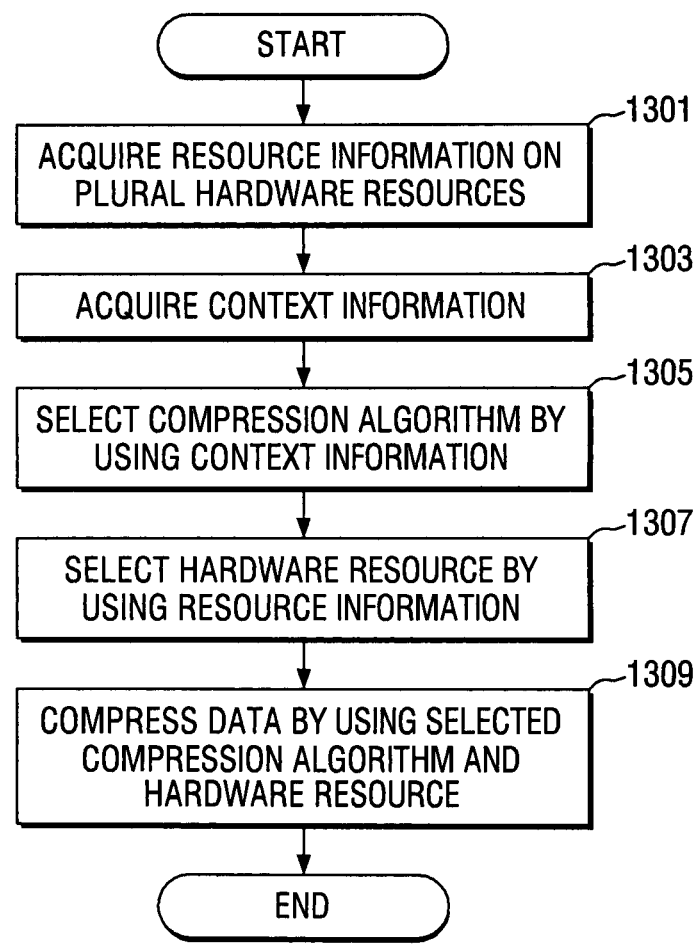
FIG. 13 illustrates an operating method of a semiconductor device according to an embodiment of the present disclosure.

FIG. 13 illustrates an operating method of a semiconductor device according to an embodiment of the present disclosure.

Referring to FIG. 13, the operating method includes acquiring resource information on a plurality of hardware resources provided in the semiconductor device in step 1301, acquiring context information on the semiconductor device after receiving a compression request of data in step 1303, selecting a compression algorithm for compressing the data by using context information among a plurality of compression algorithms in step 1305, selecting a hardware resource for performing a compression algorithm selected by using resource information among the plurality of hardware resources in step 1307, and compressing data by using the selected compression algorithm and the selected hardware resource in step 1309.

Figure 14:
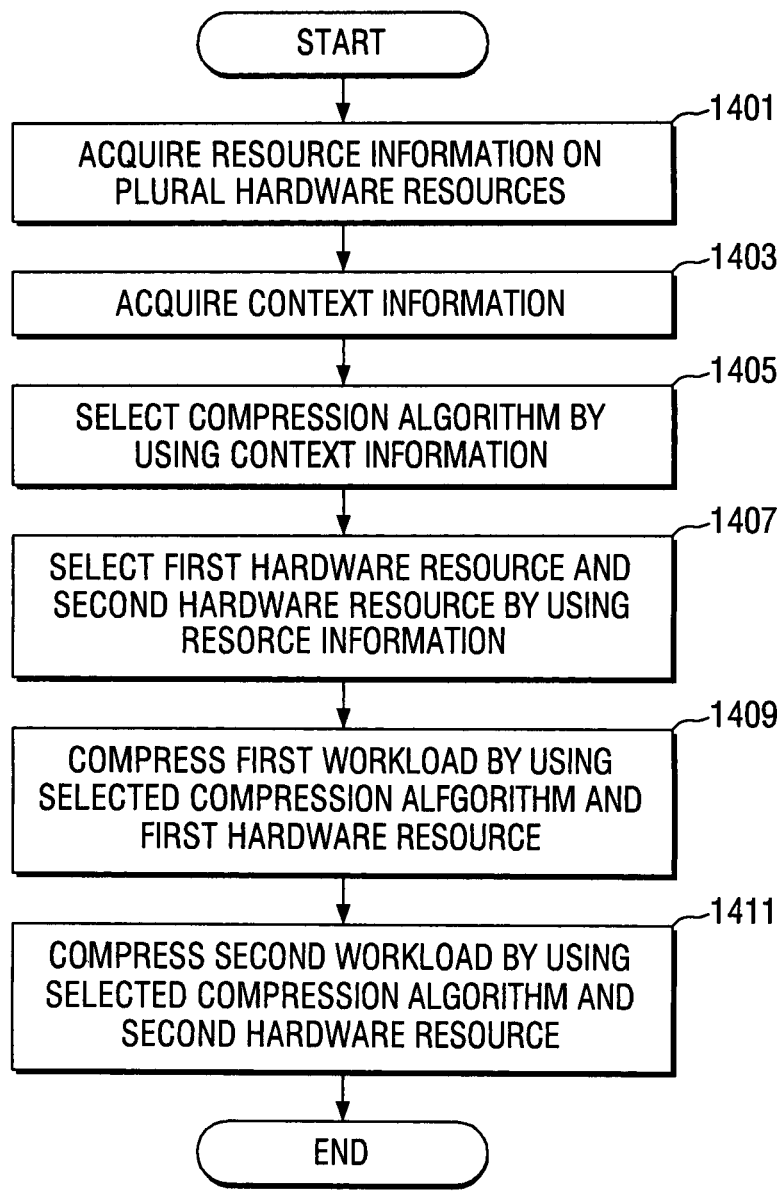
FIG. 14 illustrates an operating method of a semiconductor device according to an embodiment of the present disclosure.

FIG. 14 illustrates an operating method of a semiconductor device according to another embodiment of the present disclosure.

Referring to FIG. 14, the operating method includes acquiring resource information on a plurality of hardware resources provided in the semiconductor device in step 1401, acquiring context information on the semiconductor device after receiving a compression request of data in step 1403, selecting a compression algorithm for compressing the data by using context information among a plurality of compression algorithms in step 1405, selecting a first hardware resource for performing the selected compression algorithm with respect to a first workload of the data and a second hardware resource for performing the selected compression algorithm with respect to a second workload of the data by using resource information among the plurality of hardware resources in step 1407, compressing the first workload by using the selected compression algorithm and the first hardware resource in step 1409, and compressing the second workload by using the selected compression algorithm and the second hardware resource in step 1411.

Figure 15:
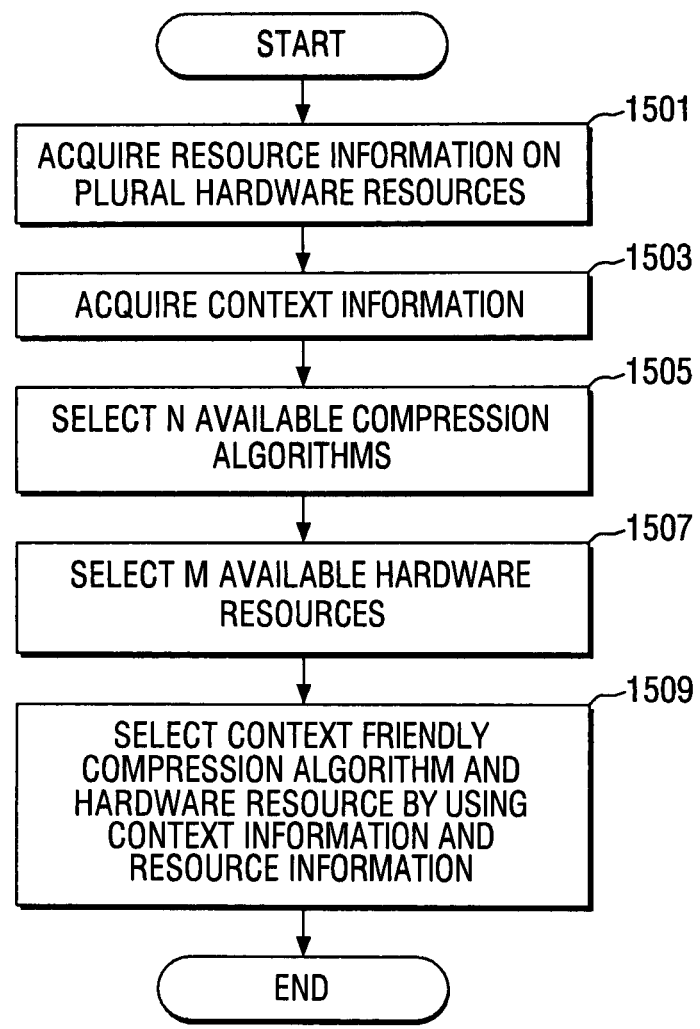
FIG. 15 illustrates an operating method of a semiconductor device according to an embodiment of the present disclosure.

FIG. 15 illustrates an operating method of a semiconductor device according to another embodiment of the present disclosure.

Referring to FIG. 15, the operating method includes acquiring resource information on a plurality of hardware resources provided in the semiconductor device in step 1501, acquiring context information by being aware of a change in state of the semiconductor device after receiving a compression request of data in step 1503, selecting N (where N is an integer of 1 or more) available compression algorithms among a plurality of compression algorithms in step 1505, selecting M (where M is an integer of 1 or more) available hardware resources among the plurality of hardware resources in step 1507, and selecting the compression algorithm and the hardware resource for compressing data by using the context information and the resource information among combinations of N available compression algorithms and M available hardware resources in step 1509.

In some embodiments of the present disclosure, the selecting of the compression algorithm and the hardware resource for compressing the data by using the context information and the resource information among the combinations of N available compression algorithms and M available hardware resources includes selecting a context-friendly compression algorithm and a context-friendly hardware resource among the combinations of N available compression algorithms and M available hardware resources. The term "context-friendly" is used herein to have the same meaning as "context-aware."

Figure 16:
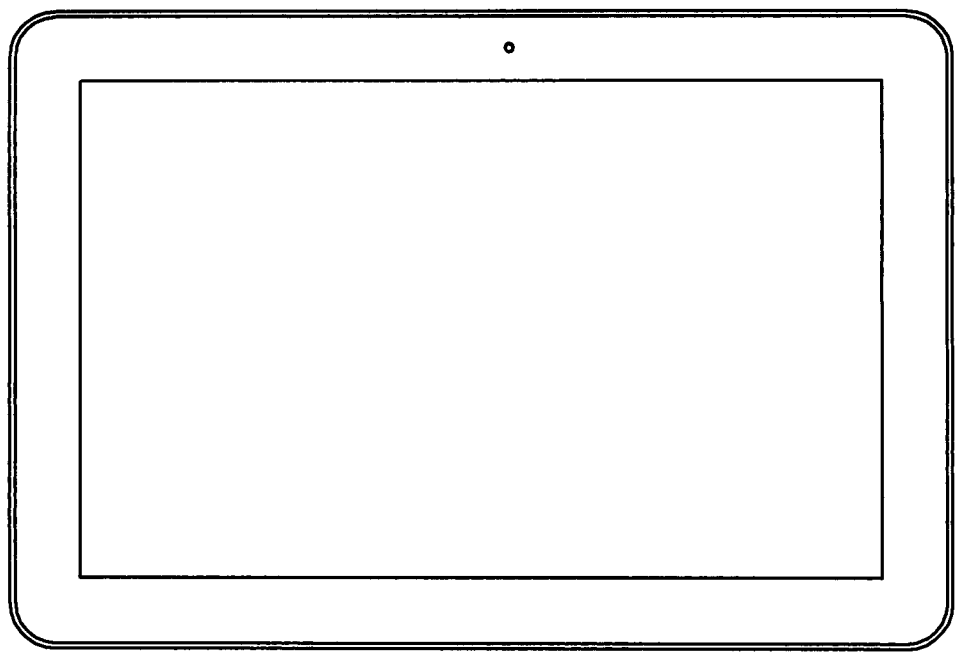
FIGS. 16 and 18 are semiconductor systems to which a semiconductor device according to embodiments of the present disclosure can be applied.
Figure 17:
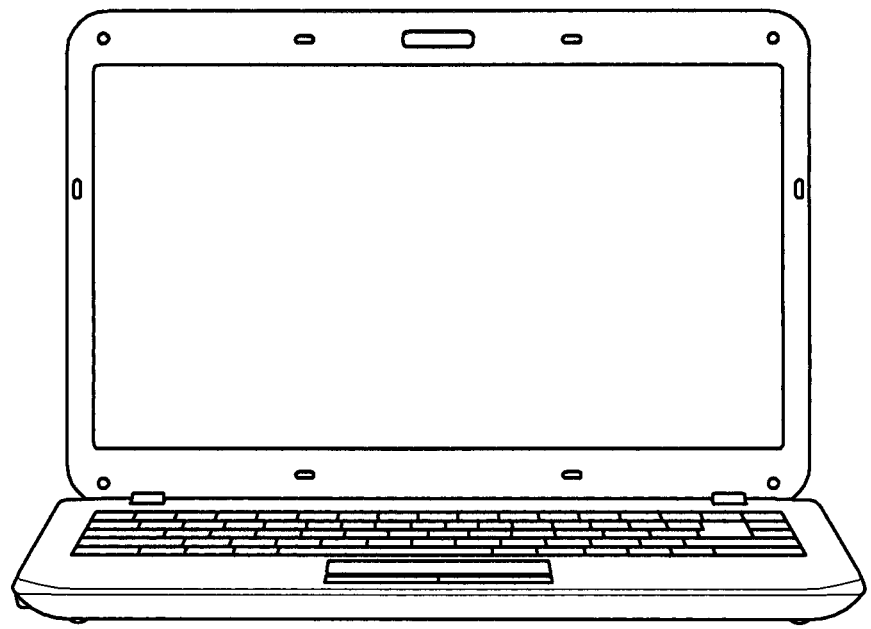
Figure 18:
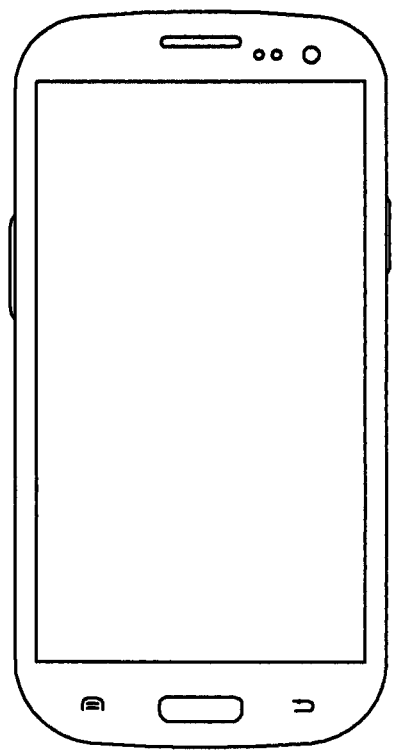

FIGS. 16 to 18 are semiconductor systems to which a semiconductor device according to embodiments of the present disclosure can be applied.

Specifically, FIG. 16 illustrates a tablet PC 1200, FIG. 17 illustrates a notebook computer 1300, and FIG. 18 illustrates a smart phone 1400. For example, the semiconductor device and the operating method of the semiconductor device according to the embodiments of the present disclosure may be used for the tablet PC 1200, the notebook computer 1300, and the smart phone 1400.

It is apparent to those skilled in the art that the semiconductor devices and the operating methods of the semiconductor devices according to some embodiments of the present disclosure may be applied even to other integrated circuit devices not illustrated. That is, although examples of the semiconductor device and the operating method of the semiconductor device according to the embodiment have included only the tablet PC 1200, the notebook computer 1300, and the smart phone 1400 as described above, the examples are not limited thereto. Further, in some embodiments of the present disclosure, the semiconductor system may be implemented by a computer, an ultra mobile PC (UMPC), a workstation, a net-book, personal digital assistants (PDA), a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player.

The foregoing is illustrative of the present disclosure and is not to be construed as limiting thereof. Although some embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A method of operating a semiconductor device, the method comprising:
   receiving a compression request or a decompression request for data;
   acquiring context information on the semiconductor device, in response to receiving the compression request or the decompression request for the data;
   selecting a compression algorithm for compressing or decompressing the data, based on the context information, wherein the context information is information of a state change;
   selecting a hardware resource with features that best match the selected compression algorithm from a first hardware resource and a second hardware resource in the semiconductor device, based on resource information, wherein the first hardware resource and the second hardware resource are heterogeneous hardware resources, and wherein the resource information is information on features of the first hardware resource and the second hardware resource, respectively, and comprises at least information on respective algorithms that are supported by each of the first hardware resource and the second hardware resource; and
   compressing or decompressing the data using the selected compression algorithm and the selected hardware resource.

2. The method of claim 1, wherein the resource information further comprises information on at least one of power consumption, a processing speed, and a supported data format.

3. The method of claim 1, wherein the resource information includes information indicating whether each of the first hardware resource and the second hardware resource is a general hardware resource or a dedicated hardware resource.

4. The method of claim 1, wherein the semiconductor device includes a mobile device, and
   wherein the resource information comprises resource information on at least one of an application processor, a cellular processor, vendor-specific hardware, a graphic processing unit, and a digital signal processor of the mobile device.

5. The method of claim 1, wherein the context information includes context awareness information that provides awareness of a change in state of the semiconductor device.

6. The method of claim 5, wherein the context information further includes at least one of a feature of the data, a scenario to compress or decompress the data, a power state of the semiconductor device, and a state of a memory of the semiconductor device.

7. The method of claim 1, wherein selecting the compression algorithm and the hardware resource comprises dynamically selecting the compression algorithm and the hardware resource based on a change of the context information or the resource information.

8. The method of claim 1, wherein selecting the compression algorithm comprises selecting a context-friendly compression algorithm from among a plurality of compression algorithms.

9. The method of claim 1, wherein the first hardware resource and the second hardware resource each comprises a first processor and a second processor which is different from the first processor.

10. The method of claim 1, wherein the selected compression algorithm includes a first compression algorithm and a second compression algorithm that is different from the first compression algorithm, and
    wherein compressing or decompressing the data comprises one of:
    primarily compressing the data using the first compression algorithm and the selected hardware resource, and secondarily compressing the primarily compressed data using the second compression algorithm and the selected hardware resource; and
    primarily decompressing the data using the first compression algorithm and the selected hardware resource and secondarily decompressing the primarily decompressed data using the second compression algorithm and the selected hardware resource.

11. The method of claim 1, wherein the selected hardware resource includes a third hardware resource and a fourth hardware resource, and
    wherein compressing or decompressing the data comprises one of:
    primarily compressing the data using the selected compression algorithm and the third hardware resource, and secondarily compressing the primarily compressed data by using the selected compression algorithm and the fourth hardware resource; and primarily decompressing the data using the selected compression algorithm and the third hardware resource, and secondarily decompressing the primarily decompressed data using the selected compression algorithm and the fourth hardware resource.

12. A method of operating a semiconductor device, the method comprising:

receiving a compression request or a decompression request for data;

acquiring context information on the semiconductor device, in response to receiving the compression request or the decompression request for the data;

selecting a compression algorithm for compressing or decompressing the data, based on the context information, wherein the context information is information of a state change;

selecting a first hardware resource with features that best match the selected compression algorithm for a first workload of the data, and a second hardware resource with features that best match the selected compression algorithm for a second workload of the data, based on resource information, wherein the first hardware resource and the second hardware resource are heterogeneous hardware resources, and wherein the resource information is information on features of the first hardware resource and the second hardware resource, respectively, and comprises at least information on respective algorithms that are supported by each of the first hardware resource and the second hardware resource;

compressing or decompressing the first workload using the selected compression algorithm and the first hardware resource; and compressing or decompressing the second workload using the selected compression algorithm and the second hardware resource.

13. The method of claim 12, wherein power consumption of the first hardware resource is higher than power consumption of the second hardware resource.

14. The method of claim 12, wherein a processing speed of the first hardware resource is higher than a processing speed of the second hardware resource.

15. The method of claim 12, wherein the first hardware resource includes a general hardware resource, and wherein the second hardware resource includes a dedicated hardware resource.

16. The method of claim 12, wherein compressing or decompressing the first workload and compressing or decompressing the second workload are performed in parallel.

17. The method of claim 12, wherein compressing or decompressing the data by using the first hardware resource and the second hardware resource is performed in parallel to work performed by another hardware resource from among the plurality of hardware resources.

18. The method of claim 12, wherein selecting the compression algorithm comprises:

selecting, from among a plurality of compression algorithms, a first compression algorithm for compressing or decompressing the first workload, and a second compression algorithm for compressing or decompressing the second workload, wherein compressing or decompressing the first workload comprises compressing or decompressing the first workload by using the first compression algorithm and the first hardware resource, and wherein compressing or decompressing the second workload comprises compressing or decompressing the second workload using the second compression algorithm and the second hardware resource.

19. A method of operating a chip set, the method comprising:

acquiring context information by being aware of a change in state of the semiconductor device after receiving a compression request or a decompression request for data, wherein the context information is information of the change in state;

selecting N available compression algorithms among a plurality of compression algorithms;

selecting M available hardware resources among a plurality of hardware resources in the semiconductor device; and selecting a compression algorithm and a hardware resource with features that best match the selected N available compression algorithms for compressing or decompressing data using the context information and resource information among combinations of the N available compression algorithms and the M available hardware resources, wherein the resource information is information on features of the plurality of hardware resources, respectively, and comprises at least information on those algorithms that are supported by each of the plurality of hardware resources, wherein N and M are integers of 1 or more.

20. The method of claim 19, wherein selecting the compression algorithm and the hardware resource includes selecting a context-friendly compression algorithm and a context-friendly hardware resource among the combinations of the N available compression algorithms and the M available hardware resources.

* * * * *